(12) United States Patent
Seo

(10) Patent No.: US 9,265,182 B2
(45) Date of Patent: Feb. 16, 2016

(54) FLAT PANEL DISPLAY

(71) Applicant: Hae-Kwan Seo, Yongin (KR)

(72) Inventor: Hae-Kwan Seo, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 331 days.

(21) Appl. No.: 13/757,890

(22) Filed: Feb. 4, 2013

(65) Prior Publication Data

US 2014/0118952 A1   May 1, 2014

(30) Foreign Application Priority Data

Oct. 30, 2012 (KR) ........................ 10-2012-0121376

(51) Int. Cl.
H05K 7/20 (2006.01)

(52) U.S. Cl.
CPC .................................. *H05K 7/20963* (2013.01)

(58) Field of Classification Search
CPC ....... H05K 7/20; H05K 7/20963; G09G 3/36; G09F 9/00; G09F 1/1345
USPC ........... 361/688–723; 345/87; 165/80.1–80.5, 165/104.11–104.34
See application file for complete search history.

(56) References Cited

U.S. PATENT DOCUMENTS

| 5,627,730 | A  | * | 5/1997  | Konig et al. ................... 361/784 |
| 7,064,952 | B1 | * | 6/2006  | Chen et al. ............... 361/679.01 |
| 2007/0121297 | A1 | * | 5/2007  | Uchizono et al. ............. 361/704 |
| 2008/0023822 | A1 |   | 1/2008  | Lee et al. |
| 2008/0165483 | A1 | * | 7/2008  | Tanaka et al. ................. 361/681 |
| 2009/0184899 | A1 |   | 7/2009  | Kim et al. |
| 2009/0267526 | A1 | * | 10/2009 | Sung et al. ................. 315/169.3 |
| 2011/0063265 | A1 | * | 3/2011  | Kim .............................. 345/205 |
| 2014/0055328 | A1 | * | 2/2014  | Osako ............................. 345/87 |

FOREIGN PATENT DOCUMENTS

| KR | 10-2007-0056499 |   | * | 6/2007  | ........... G02F 1/1345 |
| KR | 10-2007-0056499 | A |   | 6/2007  |
| KR | 10-0771890      | B1|   | 10/2007 |
| KR | 10-2009-0079549 | A |   | 7/2009  |
| KR | 10-2011-0035649 | A |   | 4/2011  |
| KR | 10-2011-0051106 | A |   | 5/2011  |

* cited by examiner

*Primary Examiner* — Anthony Haughton
*Assistant Examiner* — Yahya Ahmad
(74) *Attorney, Agent, or Firm* — Lee & Morse, P.C.

(57) ABSTRACT

A flat panel display (FPD) including a display panel for displaying an image; a film substrate electrically connected to the display panel, the film substrate including driving circuits; a printed circuit board (PCB) electrically connected to the film substrate, the printed circuit board providing a signal for displaying the image; and a heat radiating unit attached to one surface of the film substrate, the heat radiating unit contacting at least one of the display panel and the PCB.

14 Claims, 2 Drawing Sheets

FLAT PANEL DISPLAY

CROSS-REFERENCE TO RELATED APPLICATION

This application claims priority under 35 U.S.C. §119 to Korean Patent Application No. 10-2012-0121376, filed on Oct. 30, 2012, in the Korean Intellectual Property Office, the entire content of which is incorporated herein by reference.

BACKGROUND

1. Field

Embodiments relate to a flat panel display (FPD).

2. Description of the Related Art

A flat panel display (FPD), e.g., a liquid crystal display (LCD) and an organic light emitting display (OLED), may include a display panel (for displaying an image) and driving circuits (for providing signals to the display panel) in order to display the image.

In the display panel, a plurality of pixels may be connected between a plurality of scan lines and data lines, e.g., in a matrix. The driving circuits may include scan driving circuits (for driving the plurality of scan lines) and data driving circuits (for driving the plurality of data lines). Scan signals may be sequentially supplied from the scan driving circuits to the plurality of scan lines so that pixels are selected, and data signals may be supplied from the data driving circuits to the data lines connected to the selected pixels so that a predetermined image is displayed.

As the resolution of the FPD increases, a number of scan lines and data lines increases, so that the size of the driving circuits and the number of driving circuits increase. The increase in the size of the driving circuits means an increase in channels. The power consumption of the driving circuits may increase as the channels increase. Thus, heat emission may increase. In the case of the display panel that displays a high resolution image or a three-dimensional image, the driving circuits should operate at high speed. Thus, a problem may be generated by heat emission.

SUMMARY

Accordingly, the embodiments provide a flat panel display (FPD) capable of effectively radiating heat generated by driving circuits.

In order to achieve the foregoing and/or other aspects of the embodiments, there is provided a flat panel display (FPD), including a display panel for displaying an image, film substrates electrically connected to the display panel and including driving circuits, printed circuit boards (PCB) electrically connected to the film substrates to provide a signal for displaying the image, and heat radiating units attached to one surface of each of the film substrates and contacting at least one of the display panel and the PCBs.

Each of the heat radiating units may include a first contacting unit attached to one surface of the film substrate and at least one second contacting unit that protrudes from an edge of the first contacting unit to the outside and that contacts at least one of the display panel and the PCB.

The heat radiating units may be formed of a thin film-shaped thermally conductive material and may be attached to one surface of each of the film substrate by an adhesive including heat radiating paste.

Protrusions may be provided on at least one surface of the heat radiating unit. Metal pads may be provided in the display panel and the PCBs that the heat radiating units contact.

According to the embodiments, heat generated by the driving circuits and heat generated by input terminals, output terminals, and pads may be rapidly radiated to the outside by the heat radiating units and may be delivered to the display panel and the PCBs through the heat radiating units. Thus, it is possible to prevent the driving circuits from being defective due to accumulation of heat.

BRIEF DESCRIPTION OF THE DRAWINGS

The accompanying drawings, together with the specification, illustrate exemplary embodiments, and, together with the description, serve to explain the principles of the embodiments.

DETAILED DESCRIPTION

The embodiments now will be described more fully with reference to the accompanying drawings. The embodiments may, however, be embodied in many different forms and should not be construed as being limited to the embodiments set forth herein; rather, these embodiments are provided so that this disclosure will be thorough and complete, and will fully convey the concept of the embodiments to those skilled in the art.

Figure 1:
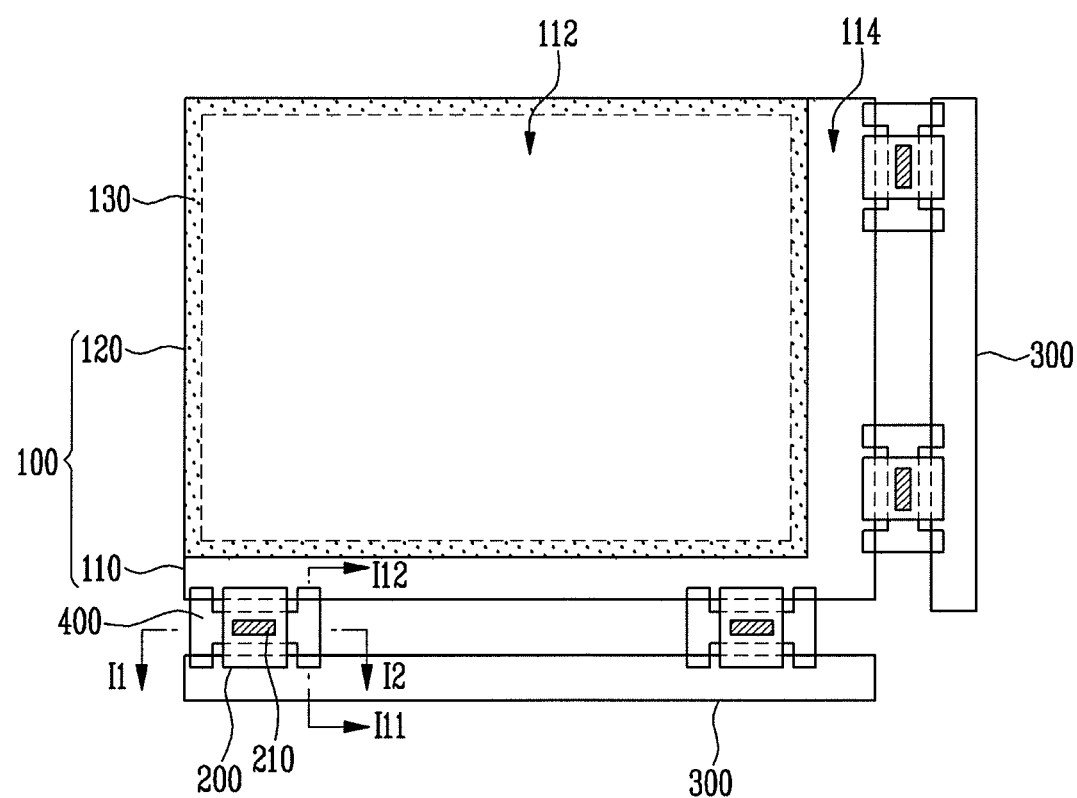
FIG. 1 illustrates a schematic plan view of a flat panel display (FPD) according to an embodiment.

FIG. 1 illustrates a schematic plan view illustrating a flat panel display (FPD) according to an embodiment.

Referring to FIG. 1, the FPD may include a display panel 100 (for displaying an image), a film substrate 200 electrically connected to the display panel 100, a printed circuit board (PCB) 300 electrically connected to the film substrate 200, and a heat radiating unit 400 attached to a bottom of the film substrate 200 to contact at least one of the display panel 100 and the PCB 300.

The display panel 100 may include a first substrate 110, a second substrate 120, and a pixel array between the first substrate 110 and the second substrate 120.

The first substrate 110 and the second substrate 120 may be formed of, e.g., a transparent material such as glass and quartz or an opaque material such as metal. The first substrate 110 may include a display area 112 and a non-display area 114 around the display area 112. The second substrate 120 may be on the first substrate 110 including the display area 112 and a part of the non-display area 114. A sealing material 130 may be formed between the first substrate 110 and the second substrate 120 of the non-display area 114 to surround the display area 112. The pixel array provided between the first substrate 110 and the second substrate 120 of the display area 112 may be sealed up by the sealing material 130.

The pixel array may include a plurality of pixels connected between a plurality of scan lines and a plurality of data lines, e.g., in a matrix, and may include liquid crystal cells or organic light emitting diodes (OLED) and may further include thin film transistors (TFT) and capacitors for driving the pixels.

The film substrate 200 may include a driving circuit 210. The driving circuit 210 (in the form of integrated circuit (IC)

chips) may be mounted on the film substrate 200. Input and output terminals of the driving circuit 210 may be electrically connected to wiring lines (not shown) on the film substrate 200. The film substrate 200 may be in the form of, e.g., a chip on film (COF). The driving circuit 210 may be formed of a scan driving circuit (for supplying scan signals to the scan lines) or a data driving circuit (for supplying data signals to the data lines).

The PCB 300 may include ICs and elements for receiving an image signal from an outside of the flat panel display and for generating a signal for driving the display panel 100 and various control signals. The PCB 300 may be connected to the film substrate 200 including the scan driving circuits and the film substrate 200 including the data driving circuits.

For example, a plurality of input pads may be formed on one side of the display panel 100 to be connected to the scan lines through the wiring lines, and a plurality of film substrates 200 (including the scan driving circuits) may be electrically connected to the plurality of input pads. In addition, the plurality of input pads may be formed on another side of the display panel 100 to be connected to the data lines through wiring lines, and a plurality of film substrates 200 (including the data driving circuits) may be electrically connected to the plurality of input pads.

The output terminals of the PCB 300 may be electrically connected to the input terminals of the film substrate 200, and the output terminals of the film substrate 200 may be electrically connected to the input pads of the display panel 100. The output terminals and the input terminals and/or the output terminals and the input pads may be arranged to overlap each other and may be compressed with an anisotropic conductive film interposed to be electrically connected to each other.

The heat radiating unit 400 (in the form of a thin film or a tape made of a thermally conductive material) may be formed of one or more alloys including a metal selected from the group of Al, Cu, and W.

Figure 2:
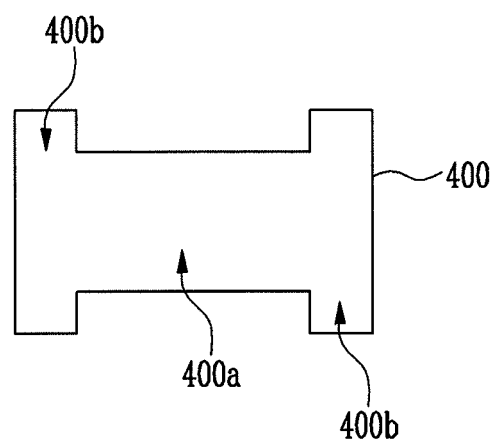
FIG. 2 illustrates a plan view of an embodiment of the heat radiating unit of FIG. 1.

Referring to FIG. 2, the heat radiating unit 400 may include a first contacting unit 400a (having a same size as or being larger than the film substrate 200) and/or at least one second contacting unit 400b that protrudes from an edge of the first contacting unit 400a to an outside, e.g., away from the first contacting unit 400a. The at least one second contacting unit 400b may be formed on one side of the first contacting unit 400a at uniform intervals. In an implementation, the at least one second contacting unit 400b may be formed on both sides of one side one by one. The heat radiating unit 400 may be in the form of, e.g., "H" or "I".

Figure 3:
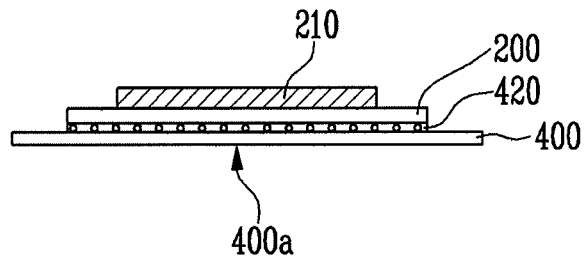
FIG. 3 illustrates a sectional view taken along the line I1-I2 of FIG. 1.

Referring to FIG. 3, the first contacting unit 400a of the heat radiating unit 400 may be attached to a bottom of the film substrate 200 by an adhesive 420 that includes a heat radiating paste.

Figure 4:
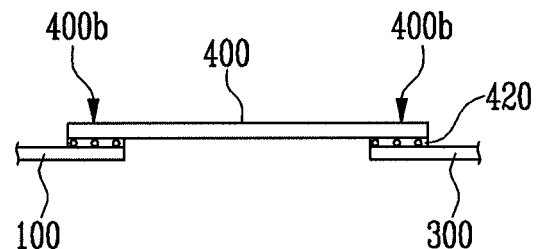
FIGS. 4 and 5 illustrate sectional views taken along the line I11-I12 of FIG. 1.

In an implementation, referring to FIG. 4, the second contacting units 400b of the heat radiating unit 400 may be adhered to the display panel 100 and the PCB 300 by the adhesive 420 including the heat radiating paste.

Figure 5:
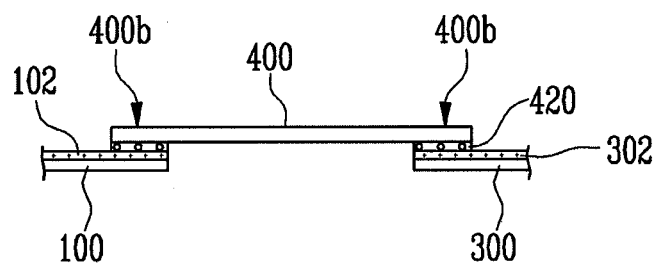

Referring to FIG. 5, metal pads 102 and 302 may be formed on regions of the display panel 100 and the PCB 300 that contact the second contacting units 400b. The metal pads 102 and 302 may be formed of metal having high thermal conductivity. In an implementation, the metal pads 102 and 302 may be formed of an electrode or metal wiring line material, e.g., Al, Cu, and W in a process of manufacturing the display panel 100 and/or the PCBs 300. The second contacting units 400b may contact the metal pads 102 and 302 to expedite or facilitate heat delivery and radiation. Therefore, the metal pads 102 and 302 may be formed to have an area as large as possible. In order to secure a large area, the metal pads 102 and 103 may be connected to, e.g., a ground wiring line or a common wiring line.

Figure 6:
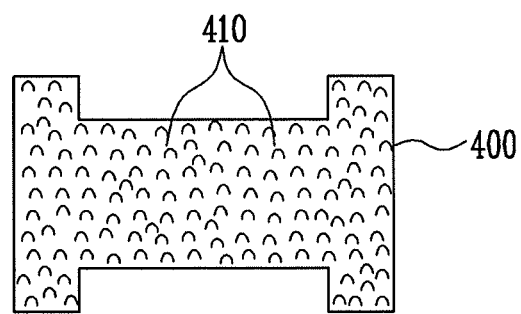
FIG. 6 illustrates a plan view illustrating another embodiment of the heat radiating unit of FIG. 1.

Referring to FIG. 6, at least one surface of the heat radiating unit 400 may be concavo-convex. For example, protrusions 410 may be formed on one surface or both surfaces of the heat radiating unit 400 to increase a surface area of the heat radiating unit 400 and to facilitate radiation of heat. The protrusions 410 may be formed by, e.g., etching the surface of the heat radiating unit 400 or by depositing another material on the surface of the heat radiating unit 400.

As illustrated in FIG. 1, the heat radiating units 400 may contact the display panel 100 and the PCBs 300. However, in an implementation, the heat radiating units 400 may contact only the display panel 100 or the PCBs 300 as desired.

In the FPD having the above structure, heat generated by the driving circuits 210 of the film substrates 200 may be rapidly radiated to the outside through the surfaces of the heat radiating units 400 and may be delivered to the display panel 100 and/or the PCB 300 through the heat radiating units 400. Thus, it is possible to effectively reduce and/or prevent the driving circuits from being damaged due to accumulation of heat.

When the heat radiating unit 400 contacts only the film substrate 200, heat may be radiated to the outside only in accordance with an area of the heat radiating units 400. When an amount of heat emission is larger than the amount of heat radiation, accumulation of heat may be inevitable. However, the heat radiating unit 400 may contact the display panel 100 and the PCB 300, so that heat may be radiated to the outside while being delivered and may be radiated to the outside through the display panel 100 and the PCB 300. Thus, heat radiation effect may be excellent.

For example, high temperature heat may be generated by the input terminals, the output terminals, and the pads to which a power voltage is delivered or supplied. According to the embodiments, the heat radiating unit 400 may contact parts adjacent to the input terminals, the output terminals, and the pads. Thus, problems associated with accumulation of heat may be reduced and/or prevented.

By way of summation and review, when heat generated by the driving circuit is not rapidly radiated to the outside but rather is accumulated, an erroneous operation may be caused, or the operation of the driving circuits may be stopped.

The embodiments provide a flat panel display (FPD) capable of effectively radiating heat generated by driving circuits.

For example, heat generated by the driving circuits and heat generated by input terminals, output terminals, and pads may be radiated to the outside and may be delivered to the display panel and the PCBs through the heat radiating units. Thus, it is possible to effectively reduce and/or prevent the driving circuits from being damaged due to accumulation of heat.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A flat panel display (FPD), comprising:
   a display panel for displaying an image;
   a film substrate electrically connected to the display panel, the film substrate including driving circuits;

a printed circuit board (PCB) electrically connected to the film substrate, the printed circuit board providing a signal for displaying the image; and a heat radiating unit attached to one surface of the film substrate, the heat radiating unit contacting and being in thermal cooperation with at least one of the display panel and the PCB.

2. The FPD as claimed in claim 1, wherein the heat radiating unit includes:

a first contacting unit attached to the one surface of the film substrate; and at least one second contacting unit that protrudes from an edge of the first contacting unit to an outside of the heat radiating unit, the second contacting unit contacting at least one of the display panel and the PCB.

3. The FPD as claimed in claim 1, wherein the heat radiating unit is formed of a thin film-shaped thermally conductive material.

4. The FPD as claimed in claim 3, wherein the thermally conductive material is formed of one or more alloys including a metal selected from the group of Al, Cu, and W.

5. The FPD as claimed in claim 1, wherein the heat radiating unit is attached to the one surface of the film substrate by an adhesive including a heat radiating paste.

6. The FPD as claimed in claim 1, wherein the heat radiating unit includes protrusions on at least one surface thereof.

7. The FPD as claimed in claim 1, wherein the display panel and the PCB each include metal pads, the heat radiating unit contacting the metal pads of at least one of the display panel and the PCB.

8. The FPD as claimed in claim 1, wherein the heat radiating unit contacts and is in thermal cooperation with the display panel and the PCB.

9. A flat panel display (FPD), comprising:

a display panel for displaying an image;

a film substrate electrically connected to the display panel, the film substrate including driving circuits;

a printed circuit board (PCB) electrically connected to the film substrate, the printed circuit board providing a signal for displaying the image; and a heat radiating unit attached to one surface of the film substrate, the heat radiating unit contacting at least one of the display panel and the PCB, wherein the heat radiating unit includes:

a first contacting unit attached to the one surface of the film substrate; and at least one second contacting unit that protrudes from an edge of the first contacting unit to an outside of the heat radiating unit, the second contacting unit contacting at least one of the display panel and the PCB.

10. The FPD as claimed in claim 9, wherein the heat radiating unit is formed of a thin film-shaped thermally conductive material.

11. The FPD as claimed in claim 10, wherein the thermally conductive material is formed of one or more alloys including a metal selected from the group of Al, Cu, and W.

12. The FPD as claimed in claim 9, wherein the heat radiating unit is attached to the one surface of the film substrate by an adhesive including a heat radiating paste.

13. The FPD as claimed in claim 9, wherein the heat radiating unit includes protrusions on at least one surface thereof.

14. The FPD as claimed in claim 9, wherein the display panel and the PCB each include metal pads, the heat radiating unit contacting the metal pads of at least one of the display panel and the PCB.

* * * * *